United States Patent
Eva

(10) Patent No.: US 8,780,448 B2
(45) Date of Patent: Jul. 15, 2014

(54) LENS BLANK AND LENS ELEMENTS AS WELL AS METHOD FOR THEIR PRODUCTION

(75) Inventor: Eric Eva, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 13/465,662

(22) Filed: May 7, 2012

(65) Prior Publication Data

US 2012/0218643 A1 Aug. 30, 2012

Related U.S. Application Data

(60) Continuation of application No. 12/851,073, filed on Aug. 5, 2010, now Pat. No. 8,174,771, which is a division of application No. 11/775,991, filed on Jul. 11, 2007, now Pat. No. 7,791,811.

(30) Foreign Application Priority Data

Jul. 11, 2006 (DE) .......................... 10 2006 031 995

(51) Int. Cl.
  *G02B 3/00* (2006.01)
  *G02B 9/00* (2006.01)
(52) U.S. Cl.
  USPC .......................................................... 359/649

(58) Field of Classification Search
  USPC .................. 351/159, 160 H, 160 R, 161–176, 351/159.01; 359/642, 649; 264/1.1, 1.32
  See application file for complete search history.

(56) References Cited

U.S. PATENT DOCUMENTS

| | | | |
|---|---|---|---|
| 3,573,954 A | | 4/1971 | Yamamoto |
| 5,344,448 A | * | 9/1994 | Schneider et al. ........... 623/6.28 |
| 5,717,518 A | | 2/1998 | Shafer et al. |
| 2003/0117576 A1 | | 6/2003 | Thakrar et al. |
| 2004/0016743 A1 | | 1/2004 | Motakef et al. |
| 2005/0016446 A1 | | 1/2005 | Abbott, III et al. |

FOREIGN PATENT DOCUMENTS

| | | |
|---|---|---|
| DE | 101 42 893 A1 | 10/2003 |
| DE | 10 2004 009 577 B3 | 3/2005 |
| EP | 1 114 802 A1 | 7/2001 |

* cited by examiner

*Primary Examiner* — James Greece
(74) *Attorney, Agent, or Firm* — Edell, Shapiro & Finnan, LLC

(57) ABSTRACT

A method for manufacturing a preferably asymmetrical lens element (5*a*) from a tempered blank (1) is characterized by: producing the lens element (5*a*) from a first partial volume (1*a*) of the tempered blank (1), whose thickness d is less than approximately 70%, preferably less than approximately 60%, particularly preferably less than approximately 50% of the thickness D of the tempered blank (1). Preferably, from a second partial volume (1*b*) of the tempered blank (1) at least a further lens element (5*a*') is produced, wherein before the lens elements (5*a*, 5*a*') are produced the tempered blank (1) is divided into the first and second partial volume (1*a*, 1*b*).

16 Claims, 4 Drawing Sheets

LENS BLANK AND LENS ELEMENTS AS WELL AS METHOD FOR THEIR PRODUCTION

CROSS-REFERENCE TO RELATED APPLICATIONS

This application is a Continuation of U.S. application Ser. No. 12/851,073, filed on Aug. 5, 2010, which is a Divisional of U.S. application Ser. No. 11/775,991, filed on Jul. 11, 2007, which, in turn, claims priority under 35 U.S.C. §119(a) to German Patent Application No. 10 2006 031 995.8, filed on Jul. 11, 2006, the entire contents all of which are hereby incorporated by reference.

BACKGROUND TO THE INVENTION

The invention relates to a method for producing a preferably asymmetrical lens element from a tempered blank; to a lens blank for microlithography, preferably with cylindrical geometry; as well as to lens elements and to a projection lens with such a lens element.

Lens elements made of fused silica are, for example, used in projection exposure apparatuses for microlithography. In such apparatuses, radiation generated by a usually pulsed laser at an operating wavelength of e.g. 248 nm (KrF laser) or 193 nm (ArF laser) is imaged to a sharply delimited very homogeneously illuminated image field by means of an illumination system, in which image field a mask is arranged. A pattern that is provided on the mask is imaged, by means of a downstream projection lens, at a reduced scale on a semiconductor wafer that comprises a light-sensitive layer.

For wavelengths of 250 nm and below, which wavelengths are used in such systems, birefringence of the fused silica material plays an important role. The term "birefringence" refers to the splitting, which occurs in optically anisotropic materials, of the incident radiation into two partial beams that are polarized perpendicularly in relation to each other and in relation to the direction of propagation (ordinary and extraordinary beams) of different propagation speeds. The axis with the higher propagation speed is also referred to as the "fast axis".

As a result of the different propagation speeds, after passing through the optical material the two partial rays undergo a phase shift, which in an imaging optical arrangement can have a negative effect on its ability to provide a true image, i.e. on the imaging contrast. Therefore, optical components used in lithography optics applications should have as little birefringence as possible. Furthermore, in so-called polarization-preserving lithography systems a polarization state, once set in the illumination system, should be preserved as well as possible right to the wafer, i.e. the projection lens should maintain polarization to the greatest possible extent, which is made considerably more difficult by birefringence.

The blanks made of synthetic fused silica that are used in the manufacture of lenses, which blanks usually consist of cylindrical discs, are manufactured by way of flame hydrolysis (soot process) or in the direct process (direct vitrification) at high temperatures. In order to prevent birefringence, which can occur as a result of mechanical strain during fast cooling of the blanks, the blanks are subjected to tempering treatment, i.e. for an extended period of time (e.g. 50 h) they are held at high temperatures (usually in excess of 1800° C.) before they are slowly cooled to room temperature.

DE 10 2004 009 577 A1 describes a method for manufacturing optical components, in which method a first tempering treatment at high temperatures is followed by a second tempering treatment at low temperatures, e.g. between 350° C. and 800° C. By means of the second tempering treatment the essentially tangential alignment of the fast axis of the birefringence on the longitudinal axis of the cylinder should be able to be transformed into an essentially radial alignment. Furthermore, the blanks manufactured in this way are said to be more resistant to decompacting (rarefaction).

In order to determine the strain birefringence (SBR) of the lenses cut from the blanks before they are installed in an optical system, and if necessary to be able to initiate measures to compensate for it, the strain birefringence of each blank is measured after tempering, namely along the longitudinal axis of the cylindrical blank-disc (z-direction), which longitudinal axis essentially corresponds to the direction of passage of the light. In this method, a value of the strain birefringence, which value has been integrated over the z-axis and has been averaged, is determined. For the purpose of measuring, devices are used that produce a strain birefringence at 633 nm (He—Ne laser) and that can scan the blank automatically in the x- and y-directions. In most cases involving fused silica, an essentially rotationally-symmetrical distribution of the SBR in the x-y-plane is detected in this process, wherein its absolute value increases squarely with the distance from the center point (corresponding to the longitudinal axis of the cylinder). In this arrangement the orientation of the fast axis of the SBR normally is predominantly tangential or radial. The specified SBR at 633 nm in the case of averaging across the circumference of the optically clear diameter is typically in an interval of between 0.2 nm/cm and 1 nm/cm, most often at 0.5 nm/cm.

When using the lenses, formed from the blanks, in optical systems of the applicant, an SBR has been observed that differs from the SBR measured on the blanks by means of the above methods, even after the contributions that material processing, material refining and mounting techniques make to SBR have been taken into account. During investigations as to the reasons for this material-related SBR, the inventor found that in particular highly curved lenses, already after cutting the lens-form into the blank and after polishing, but before mounting and coating, have an SBR that is higher than the SBR predicted on the basis of initial measurement of the blank by weighting with the local lens density. Furthermore, it has been observed that a tangential distribution of the fast axis in the blank can transform into a radial distribution in the lens (or vice-versa).

Such a difference between the SBR of the cut lens and the SBR measured on the blank has been observed in particular in the case of asymmetrical lenses. In an asymmetrical lens the radii of curvature of the two optically effective surfaces differ as far as their absolute values and/or their signs are concerned. In aspherical lenses where if applicable no radii of curvature have been defined, the term "asymmetrical lens" refers to a lens in which no plane can be determined, in relation to which the lens has a mirror symmetry. The difference described above is particularly pronounced in the case of highly curved lenses, i.e. in lenses in which the two radii of curvature differ significantly from each other, e.g. in an extreme case in plano-convex lenses, but also in meniscus lenses that essentially have the same large radii of curvature with opposite signs.

In order to understand the origin of the effects described above, the density distribution of the blank has to be examined in more detail, which density distribution results during the tempering process. As stated above, during tempering, the blank is heated to a maximum temperature of up to 1800° C. (glass temperature), is held for several hours to days at this temperature, and is then slowly cooled at a defined rate. Generally speaking, the slower the rate of cooling, the higher the resulting density. Furthermore, there is a temperature range of 1000° C. to 1500° C. in which there is an anomaly in the dependence of the density on the rate of cooling; i.e. in this temperature range the density increases as the cooling rate increases. By controlling the cooling rate it is possible to have an influence as to which process dominates. Apart from this, the OH content and thus the coefficient of thermal expansion (CTE) of the blank can also have a radial dependence, and can thus also lead to a rotationally symmetrical density distribution.

In the context of the density distribution arising during the tempering process it is essential that normally the slower the rate of cooling, the higher the resulting density. Since cooling takes place over the surfaces of the cylindrical blank, volume elements that are close to the edge cool faster than do volume elements that are near the centre, and therefore have a different, usually lower, density.

FIG. 5a shows a lateral view (zx-section of an xyz-coordinate system) of a tempered blank 1, during whose tempering the cooling-rate anomaly did not dominate, and which blank 1 showed adequately homogeneous OH distribution. The near-center volume elements of said blank 1 therefore have a higher density than its edge regions. The regions 2a to 2d, which are shown in a dotted line in FIG. 5, show regions of identical density. They are nested in the manner of onion skins and in the center form spheroids (regions 2a, 2b), while towards the edge they extend to the corners (regions 2c, 2d), i.e. they tend to become cylindrical discs. Overall, the tempered blank 1 has a density distribution which extends rotation-symmetrically in relation to the z-axis as well as mirror-symmetrically in relation to a central plane (not shown) of the tempered blank 1, which central plane extends so as to be perpendicular in relation to the z-direction.

In the tempered blank 1 (tensile) strain 3a to 3d forms, which acts perpendicularly to the region 2a to 2d and whose amount and direction is shown by lines in FIG. 5a. The amount of the strain 3a to 3d, and thus the amount of the birefringence, increases in the tempered blank 1 from the inside to the outside.

In the case of SBR-measuring in z-direction in the manner described above, the strain components in the xy-plane are integrated along the z-direction over the thickness D of the tempered blank 1. Strain 3d that occurs parallel in relation to the z-axis is not detected, while strain 3a in circumferential direction is fully detected, which is consistent with the observed $r^2$-distribution of the density amplitude. In relation to tension 3b, 3c with a 45° orientation, only the xy-component is detected, while the z-components are not detectable during standard measuring, and even during measuring with the blank tilted they are only detected conditionally, because the z-components of the strain 3b and 3c extending into the corners act in opposite directions, thus canceling each other out. If, as is the case in the state of the art, asymmetrical lens elements are cut from the tempered blank 1, as shown in FIG. 5b in relation to a meniscus lens element 4 and in FIG. 5c in relation to a plano-convex lens element 5, two effects occur, which are described in more detail below.

At first strain 3b occurs in the edge regions of the lens elements 4, 5, which strain extends so as to be essentially parallel in relation to the lens surfaces. Depending on the precise beam path, this strain can be almost perpendicular in relation to the direction of light and will thus result in high SBR observed. In contrast to this, in the middle, i.e. along the longitudinal axis of the tempered blank 1, the strain extends parallel in relation to the z-axis. As long as the beam path in this arrangement extends so as to be more or less parallel in relation to the z-axis, no SBR is observed. Only if the beam path extends obliquely through the middle of the lens, do SBR components occur; a situation which differs from that of e.g. a symmetrical biconvex lens.

Moreover, the volume of the tempered blank 1, from which the lens elements 4, 5 are formed, comprises a multitude of regions of equal density 2a to 2d. In the middle, i.e. along the longitudinal axis of the tempered blank 1, the density gradients extend parallel in relation to the lens surfaces, while at the edge they extend so as to be perpendicular to them. If the form of a body comprising internal mechanical strain is changed (in the present example from a cylindrical shape to a meniscus or plano-convex shape) then said body attempts to again assume a state of minimum energy. Said body will thus slightly deform in relation to the intended contour and in this process the strain will partly relax and partly shift. A body with high density gradients that are oriented differently, which body is formed by the lens elements 4, 5, thus behaves in an unfavorable manner in the sense that the shift in strain can be calculated in advance only with considerable difficulty and in that the precise effect of such shift in strain can only be clarified by means of experiments or by means of elaborate simulation.

If asymmetrical lens elements are cut from tempered blanks in a manner described in FIG. 5b and FIG. 5c, the unfavorable effects described above thus occur, namely on the one hand a high SBR observed in the edge regions of the lens elements, and on the other hand a shift in the strain after cutting the lens elements, which shift results in a shift of the SBR.

OBJECT OF THE INVENTION

It is an object of the invention to provide a method for producing a lens element, as well as lens elements with reduced and/or defined adjustable strain birefringence, as well as to a lens blank for producing such lens elements, and to a projection lens with such a lens element.

SUMMARY OF THE INVENTION

According to one aspect of the invention, a method of the type mentioned in the introduction is provided, in which method the lens element is produced from a first partial volume of the tempered blank, whose thickness d is less than approximately 70%, preferably less than approximately 60%, particularly preferably less than approximately 50% of the thickness D of the tempered blank.

In the context of this application the term "tempered blank" refers to a blank as it is obtained from the tempering process. This tempered blank is contaminated in the outer edge regions as a result of the tempering treatment; in other words, during tempering, gaseous substances, in particular sodium or sodium salts, have been diffused into the outer edge regions, which substances, while being in a gaseous state at the temperatures at which tempering is usually carried out, nevertheless are associated with sublimation and condensation that is not to be neglected, so that in those locations transmission is reduced to an intolerable degree when compared to that of further inward located regions. The edge regions are thus usually cut off by the manufacturer of the blank, i.e. the tempered blank comprises an overmeasure in diameter and thickness when compared to the cut lens blanks from which the lens elements are subsequently produced.

In the context of this application, the term "thickness D of the tempered blank" refers to the minimum distance between two opposite outer surfaces of the tempered blank, wherein these outer surfaces hereinafter are also referred to as end faces. In the case of a cylindrically formed blank, the end faces correspond to the bottom surface and the top surface of the blank. The tempered blank preferably comprises a material that is transparent to wavelengths below 250 nm, in particular at approximately 193 nm. Typically, fused silica is used for this, but other materials that are cooled in a tempering process can also be used, in particular when a refractive index of the lens element is desired, which refractive index is higher than the refractive index of fused silica.

It is proposed that an asymmetrical lens element be cut only from a partial volume of the tempered blank with a thickness of less than 70% of the entire thickness of the tempered blank. While in the method shown in FIG. 5a-c for producing lenses the edge region of the lenses are located in the corners of the tempered blank, which corners have a high SBR, during manufacture of a lens element these regions can be made so as to be less thick. Moreover, according to the invention the direction and amount of the strain along the lens element can better be evened out so that the shift in tension during cutting of the lens elements is reduced. In this context the fact that in the partial volume the minimum of the strain birefringence is not located in the middle but instead is arranged asymmetrically has an advantageous effect.

In a preferred variant at least one further lens element is produced from a second partial volume of the tempered blank. The second partial volume at the maximum corresponds to the remaining volume of the blank after the lens element has been cut out; however, it is preferable if the tempered blank is divided (cut) into the first and second partial volume before the lens elements are manufactured.

By manufacturing two or more lens elements from the tempered blank, cutting waste is reduced. In this process the tempered blank can, for example, be divided along the midplane into two partial regions of the same size, from which partial regions in each case identically formed lens elements are produced so that in order to manufacture two blanks by means of the method according to the invention the volume required is identical to the volume that is required according to the method known from prior art in order to manufacture two lens elements from two blanks that have been tempered separately. From the tempered blank it is also possible to produce two lens elements that are differently formed; in this case the tempered blank can be divided asymmetrically, but again in such a manner that a favorable strain distribution is achieved in each lens element. This is of advantage in particular if one of the lens elements already requires a height of the blank of >80 mm, because the production of blanks with thicknesses exceeding 100-120 mm is associated with problems in relation to production technology (handling, maximum machine capacity, tempering programs etc.).

In a particularly preferred variant the tempered blank is cylindrical, with dividing taking place along a plane cut-surface that is essentially aligned at a right angle in relation to the cylinder axis, or along a spherical cut-surface. In this case dividing can take place by using normal cutting tools, wherein the use of spherical cut-surfaces is associated with an advantage in that the existing volume of the blanks can be better utilized.

In a preferred variant the cut-surface is spaced apart from an end face of the cylindrical tempered blank by more than 4 cm, preferably by more than 5 cm. In this way a partial volume can be produced with a thickness that is sufficient for lenses that are typically used in microlithography.

In a further particularly advantageous variant at least on the first partial volume, prior to manufacturing the lens element, hydrogen charging takes place at a temperature of less than 550° C., preferably less than 500° C., particularly preferably less than 450° C. In this case the tempered blank is first divided, and subsequently hydrogen charging takes place. This is advantageous because the charging time increases squarely with the thickness of the blank, and in blanks exceeding 100 mm in thickness said charging time would be in the region of many months. Experience has shown that hydrogen charging has no influence or only negligible influence on strain, so that the tempered blank can be divided prior to charging.

In a particularly advantageous improvement of this variant, prior to hydrogen charging, the partial volume is made to match the shape of the lens element by means of material-removing processing. In the case of meniscus lens elements, after processing this results e.g. in a meniscus-shaped preform; in the case of plano-convex lens elements a plano-convex preform. After hydrogen charging, only a small excess thickness has to be removed from these preforms in order to achieve the final shape of the lens element. In this process hydrogen distribution is generated wherein areas of identical hydrogen content or identical hydrogen concentration extend so as to be essentially parallel in relation to the surfaces of the lens element and so as to be essentially concentric in relation to a minimum of the hydrogen content in the lens element. As an alternative, processing can also result in a preform that does not match the geometry of the lens element. In this case the geometry of the preform is selected such that, taking into account the laws of diffusion, after charging a desired hydrogen distribution occurs in the lens element. In each case further shortening of the diffusion paths can be achieved by the additional material removal so that the charging time can be further reduced.

In a particularly advantageous variant the tempered blank comprises an OH-content of less than 100 weight-ppm, preferably less than 50 weight-ppm. In such fused silica with a low OH-content, with particularly small laser-induced depolarization effects, the hydrogen necessary to prevent laser-induced adsorption has to be diffused-in in a cold state, i.e. below 550° C., wherein hydrogen charging, as described above, can also be carried out on the already divided blank. Of course, the method according to the invention can also be used in the production of commonly used fused silica for lithography (synthetic fused silica with an OH-content of between 200 and 1300 ppm).

In a further advantageous variant the tempered blank has a thickness of more than 10 cm, and the first partial volume has a thickness of less than approximately 7 cm. These ratios are optimized for producing a plano-convex lens as used as an end element of a projection lens for (immersion) lithography.

In a preferred variant the tempered blank comprises a density distribution which, at least along a direction from the end faces of the tempered blank, increases or decreases towards the inside. As described above, an increase in density from the outside to the inside usually occurs during tempering, compare FIG. 5a to FIG. 5c. However, as illustrated above, there is a temperature range from 1000° C. to 1500° C. in which the dependence of the density on the cooling rate shows an anomaly, i.e. in this case the density increases as the cooling rate increases. As a result of this it is possible during tempering to manufacture a blank whose density decreases from the end faces towards the inside. Typically the density distribution is in both cases rotationally symmetrical, essentially corresponding to the distribution shown in FIG. 5a to FIG. 5c. For strain birefringence to occur it essentially does not matter whether there is a density maximum or a density minimum in the center of the tempered blank, because the amount of the SBR is determined by the density gradient, which in both cases is smallest in the center or near the center. However, the density anomaly can be utilized to mutually cancel out the alignment of the SBR of various lenses, for example in that a radial alignment of the SBR of a first lens is compensated for by a tangential alignment of the SBR of a second lens.

In a preferred variant at least one meniscus lens element is manufactured from the tempered blank such that the vertex of the meniscus lens element is directed towards an end face of the tempered blank. In this process the regions in which the strain birefringence is particularly pronounced—i.e. the regions situated furthest to the outside in radial and in z-direction—are not used in the production of the lens element, and thus the strain birefringence in the lens element overall is reduced.

In a further variant at least one meniscus lens element is manufactured from the tempered blank such that the vertex of the meniscus lens element is directed away from an end face of the tempered blank. In this arrangement a greater absolute value of SBR is accepted, but the orientation of the SBR is then almost in z-direction. Depending on the beam path it is thus possible for the strain to act largely parallel in relation to the direction of light at the respective location in the lens, and thus not to become effective. Furthermore, the density gradients are approximately perpendicular in relation to the lens surfaces. While this will result in a clear relaxation of the strain during production of the lens form, the relaxation will however occur in the direction of the lens surfaces, i.e. there is a tendency only for a reduction in strain rather than for a shift in strain to occur. In relation to each lens geometry, by means of the beam path and an FE simulation of the expected density profile and the relaxation effects, calculations have to be made that show which of the two cases described above is the more favorable, i.e. whether the vertex of the meniscus lens is better directed towards an outer surface or away from said outer surface. It is also possible to select the less favorable case in order to inscribe a systematic rotationally symmetrical SBR that serves to compensate for birefringence that arises in other locations in the system.

In a further preferred variant, at least one plano-convex lens element is produced from the tempered blank such that the vertex of the plano-convex lens element is directed towards an end face of the tempered blank. In this way the regions which radially and in z-direction are located furthest from the mid-plane of the tempered blank are not used in the production of the lens element, and in this way the strain birefringence in the lens element is reduced. In the context of this application the term "plano-convex lens element" refers to a lens element in which the planar lens surface is essentially flat; i.e. lens surfaces with, for example, a slight spherical or aspherical curvature are considered to be planar. In the context of this application a lens in which a first, slightly curved, lens surface has a curvature of less than 20% of the curvature of the more strongly curved lens surface is still considered to be a plano-convex lens element.

The invention also relates to a lens blank for microlithography, preferably of cylindrical geometry, characterized by a minimum of the strain birefringence, which minimum in relation to a thickness D of the lens blank is arranged in a direction so as to be outside the middle. The lens blank presently described is made from the tempered blank described above, in that said tempered blank is divided into at least two parts. The normally cylindrical lens blank comprises a minimum of strain birefringence at a location that in relation to the mid-plane is arranged outside the middle, i.e. that does not have the same distance to both end faces of the lens blank. From prior art only lens blanks with a minimum of SBR are known, which minimum is positioned in the mid-plane or (as a result of inaccuracies due to the production process) is positioned in close proximity to the mid-plane of the blank so that the orientation of the lens blank in this case does not matter. In contrast to this, if a lens blank according to the invention is supplied by a manufacturer, the information relating to the original orientation has to be maintained so that the lens can be cut out when it is correctly oriented. To this effect the lens blank can comprise a mark, e.g. on one of the end faces.

In the state of the art, even subsequent material removal for removing the material contaminated by tempering does not result in a shift in the minimum of the SBR from the mid-plane; this is because in the state of the art such material removal usually takes place so as to be symmetrical in relation to the mid-plane, i.e. starting from the two end faces approximately the same amount of material is removed because the contaminated layer has the same thickness on both sides and because material wastage due to cutting is to be minimized. In the lens blank according to the invention, such material removal is not carried out on one of the end faces of the lens blank, namely on that end face which corresponds to the cut-surface, because said cut-surface was not contaminated during tempering, in contrast to the outer surfaces that were contaminated.

In a preferred embodiment the minimum is arranged at a distance from an end face of the lens blank of less than 30%, preferably less than 20% of the thickness D of the lens blank. As a result of the asymmetrical position of the minimum of the SBR, low-strain asymmetrical lens elements can be produced, as illustrated above. In this context the term "thickness D of the lens blank" refers to the thickness of the lens blank before the contaminated volume regions are cut off. As far as the lens blank after cutting off the overmeasure is concerned, the minimum is arranged at a distance to an end face of less than 15%, preferably less than 10% of the still remaining residual thickness.

In a particularly preferred embodiment the minimum is located on that outer surface which is the cut surface of the tempered blank. Provided the cut surface is essentially planar, this is favorable in particular if plano-convex lens elements are to be manufactured from the lens blank because in this case the planar lens surface is in direct proximity to the outer surface or corresponds to this outer surface.

In a further advantageous embodiment the lens blank has a transmission of more than 99%/cm, preferably more than 99.5%/cm, at a wavelength of 193 nm. Such a transmission is advantageous in the case of lens materials as used in microlithography.

In a preferred embodiment the lens blank comprises a hydrogen content of more than $0.5 \times 10^{16}$ molecules/cm$^3$, preferably more than $3 \times 10^{16}$ molecules/cm$^3$. Such a hydrogen content has a particularly advantageous effect when the lens blank is used in microlithography.

In a further exemplary embodiment the lens blank consists of fused silica or a glass-like, crystalline, polycrystalline or ceramic material. Fused silica material is the preferred lens material for microlithography. In order to increase the refractive index, in particular in lens elements that are used as end elements of projection lenses for immersion lithography, higher-refractive materials can be used, which are also subjected to a cooling process as described above.

A further aspect of the invention is implemented in a lens element that is manufactured from the lens blank as described above. Such a lens element, in particular an asymmetrical lens element, has less strain so that the strain birefringence in the lens element can be reduced or oriented in such a way that the SBR is reduced at a predefined beam path.

Another aspect is implemented in a lens element with a distribution of the strain birefringence, in which distribution the areas with identical strain birefringence are concentrically arranged on a minimum of the strain birefringence, wherein the minimum is arranged at a distance from a vertex of the lens element of at least 70%, preferably of at least 80% of the thickness L of the lens element. A lens element with such a distribution of the strain birefringence is obtained, as described above, if the lens element is produced only from a partial volume of the tempered blank.

The term "thickness L of the lens element" refers to the maximum extension of the lens element in the direction of the longitudinal axis of the lens (corresponding to its symmetry axis). In the case of a meniscus lens the thickness L therefore does not refer to the distance in longitudinal direction between the two lens surfaces that extend so as to be essentially parallel, but instead to the distance between the vertex of the convex lens surface and the maximum outer diameter of the lens element at the concave lens surface opposite the vertex. It is understood that the minimum of the strain birefringence, to which minimum the areas are arranged so as to be concentric, does not have to be located in the volume of the lens element itself; the minimum can also be located at a distance from the vertex, which distance corresponds precisely to the thickness L of the lens or is larger than said thickness L. Due to the elliptic geometry of the concentric areas in the interior of the lens element, in this case the space between the minimum and the vertex can be extrapolated. In the case of biconvex lenses, i.e. in the case of lenses that comprise two vertices, the distance is determined in relation to the vertex of the lens surface that is more strongly curved, i.e. comprises the smaller radius of curvature.

In a particularly preferred embodiment the lens element comprises a hydrogen distribution in which, at least in regions close to the surface, areas with identical hydrogen content extend so as to be essentially parallel in relation to the nearest lens surfaces. Such distribution can be obtained in that, as described above, a preform is made prior to hydrogen charging, which preform comprises a geometry that matches the lens shape. This results in a hydrogen distribution in which the surfaces with identical hydrogen content are arranged concentrically on a minimum.

In the context of this application the term "regions close to the surface" refers to regions with a spacing of approximately 2-5 mm from the lens surfaces. In the context of this application the term "essentially parallel" refers to parallel alignment in relation to the lens surfaces in a central region of up to approximately 70% of the diameter of the lens, because edge effects occur in regions that are situated radially further outward, and the areas in that region extend in particular so as to be essentially parallel in relation to an edge region of the lens, which edge region circumferentially extends in longitudinal direction of the lens and interconnects the two opposite lens surfaces.

In contrast to prior art, in which a flat cylindrical blank is charged with hydrogen so that the hydrogen distribution extends in longitudinal direction so as to be mirror-symmetrical in relation to a mid-plane of the blank, the hydrogen distribution in the present case with a lens element comprising various radii of curvature, i.e. with an asymmetrical lens element, does not comprise a symmetry axis in longitudinal direction. In this sense the hydrogen distribution in an asymmetrical lens element can also be referred to as being asymmetrical.

A further aspect is implemented in a plano-convex lens element, in which a minimum of the strain birefringence is arranged at a distance from the planar lens surface of less than 30%, preferably less than 20%, of the thickness L of the lens element between the vertex and the planar lens surface. If the "planar" lens surface comprises a curvature, the thickness L of the lens element is defined as the distance between the two vertices.

In a preferred embodiment the absolute value of the strain birefringence in close proximity to the planar lens surface, in particular on the planar lens surface is less than 0.5 nm/cm, preferably at less than 0.3 nm/cm, for a wavelength of 193 nm. The absolute value of the strain birefringence directly on the planar lens surface can be measured only with considerable difficulty; for this reason a statement concerning the SBR in close proximity to the lens surface is made, which refers to a distance of less than 5 mm, preferably less than 1 mm from the planar lens surface. If the lens is used for other wavelengths, the SBR is to be converted accordingly. The following thus applies, for example: the SBR at 633 nm multiplied by 1.4 to 1.5 results in the SBR at 193 nm.

In a particularly preferred embodiment the thickness L of the lens element is between 40 mm and 70 mm, preferably between 45 mm and 55 mm, while the radius of curvature r of the lens element is between 45 mm and 80 mm, preferably between 55 mm and 65 mm. A lens element with these dimensions is particularly suited as an end element for a projection lens used in microlithography, in which lens the more highly curved lens surface is placed in water as an immersion liquid. In a plano-convex lens element with two curved lens surfaces the term "radius of curvature r" refers to the larger radius of curvature. In particular in the case of highly curved lenses, i.e. in the case of lenses with a small radius of curvature, considerable strain is experienced, which strain is reduced in the case of the lens element according to the invention.

In a further preferred embodiment the thickness L of the lens element is between 30 mm and 80 mm, preferably between 50 mm and 70 mm, while the radius of curvature r of the lens element is between 1.0 L and 2.0 L, preferably between 1.2 L and 1.6 L. Lens elements comprising such geometries are particularly suited as end elements that are in contact with an immersion liquid that has a refractive index greater than water.

The two lens elements with the geometries described above preferably consist of fused silica material.

In a further preferred embodiment the lens element has a refractive index of more than 1.57 at a wavelength of 193 nm, wherein the thickness L of the lens element is less than 60 mm, preferably less than 50 mm. Such a lens element with a refractive index higher than fused silica can for example comprise a composite material in which higher-refractive particles are added to the fused silica, or it can consist of a glass-like, crystalline, polycrystalline or ceramic material with a refractive index greater than that of fused silica (e.g. garnet).

An additional aspect relates to a meniscus lens element, in particular manufactured according to the method described above, in which lens element the absolute value of the strain birefringence at a plane opposite the vertex, which plane comprises the optically clear diameter of the lens element, is less than 0.5 nm/cm, preferably less than 0.3 nm/cm, for a wavelength of 193 nm. At the edge of the optically used regions the strain is particularly interfering so that in that location the strain birefringence should be as small as possible. For this reason the plane with the optically clear diameter is usually placed on the mid-plane of the tempered blank so that the SBR at the optically clear diameter is particularly small.

In an advantageous embodiment the radii of curvature $r_1$, $r_2$ differ by less than 50%, preferably by less than 30%, while the average value $(r_1+r_2)/2$ of the radii of curvature $r_1$, $r_2$ in the same direction is at least 50% of the lens height H. In particular in the case of such highly curved lens elements a reduction in the SBR is particularly important. In this context the term "lens height H" refers to the space which extends between the vertex of the lens and the intersection of the symmetry axis of the lens with the plane which is determined by the optically clear diameter of the lens. This (lower) optically clear diameter is usually located a few mm above the lower mechanical lens edge, with the diameter being a few cm shorter than the mechanical outer diameter of the lens.

Yet another aspect is implemented in a projection lens for use in microlithography, which lens comprises at least one lens element as described above. Such a projection lens forms part of a projection exposure apparatus for microlithography, which apparatus, apart from the projection lens, also comprises an illumination system for the homogeneous illumination of a structure on a mask. The projection lens is used for size-reducing imaging of this structure onto a light-sensitive substrate. As a result of the lens element the strain birefringence, and consequently also the imaging characteristics, of the projection lens can be enhanced.

In a preferred exemplary embodiment the projection lens is designed in particular for immersion lithography, said lens comprising an end element formed by a plano-convex lens element as described above. In this arrangement the end element is located opposite the light-sensitive substrate, with one lens surface being immersed in the immersion liquid.

Further features and advantages are stated in the following description of exemplary embodiments, with reference to the figures of the drawing which shows significant details, and are defined by the claims. Individual features can each be used singly, or several of them can be taken together in any desired combination, in order to implement desired variations.

BRIEF DESCRIPTION OF THE DRAWINGS

Exemplary embodiments are shown in the diagrammatic drawing and are explained in the description below. The following are shown.

DETAILED DESCRIPTION OF PREFERRED EMBODIMENTS

Figure 1:
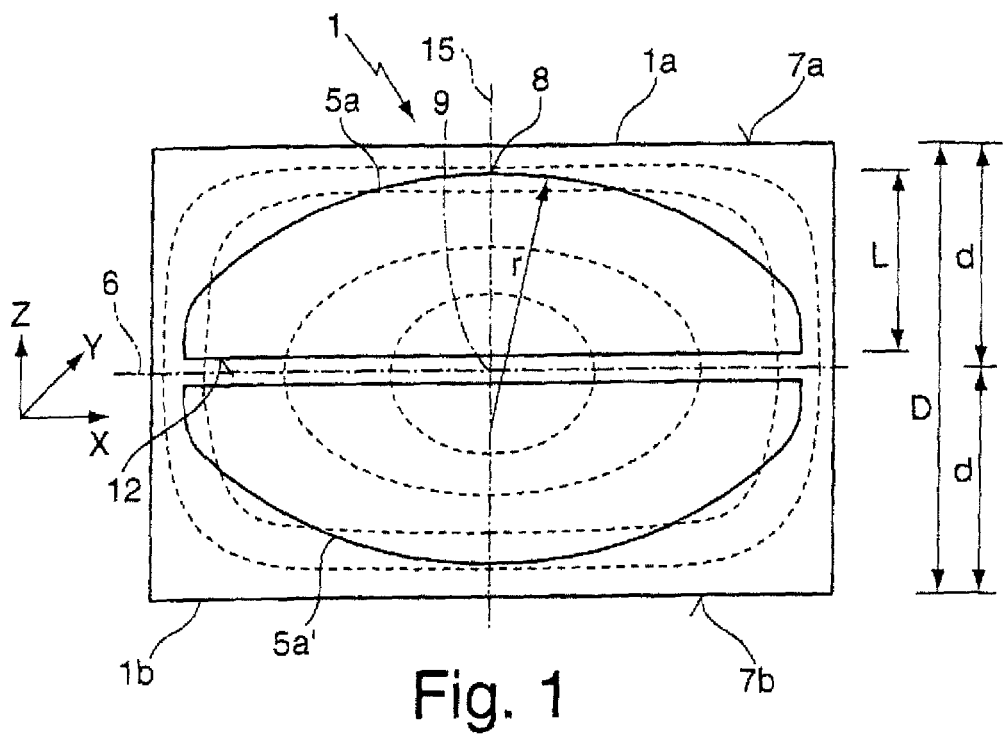
FIG. 1 a diagrammatic view of a tempered blank comprising two partial volumes, from each of which a plano-convex lens element is manufactured.
Figure 5A:
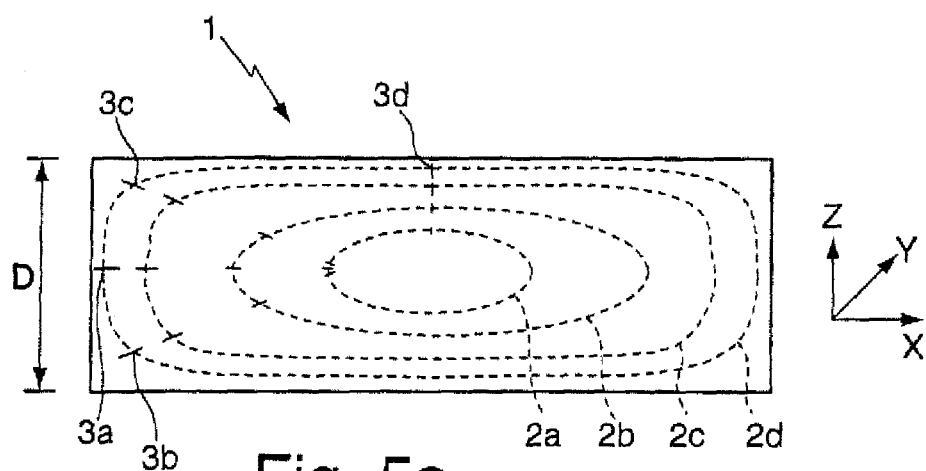
FIG. 5a-c a diagrammatic view of a tempered blank according to prior art (FIG. 5a) with a meniscus lens element (FIG. 5b) produced from it, and with a plano-convex lens element (FIG. 5c)
Figure 5B:
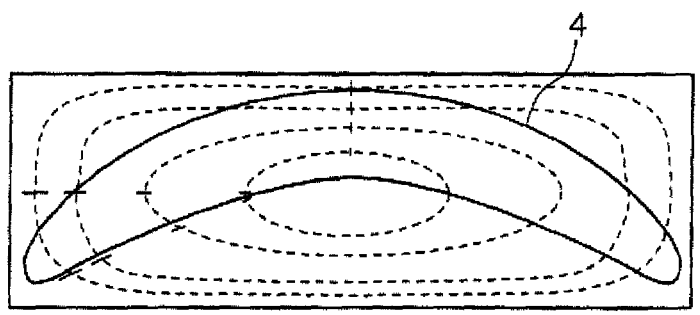
Figure 5C:
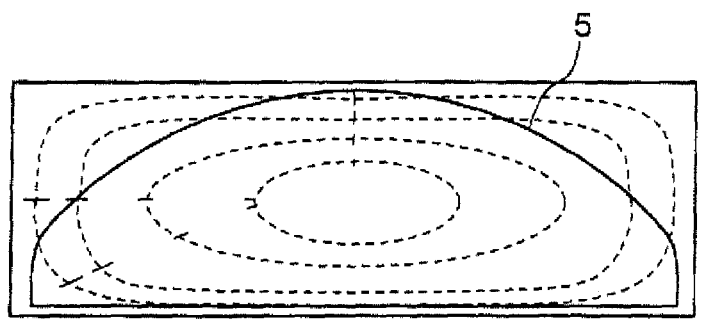

FIG. 1 shows a section of a tempered cylindrical blank 1 which comprises a thickness D of 10 cm between a first and a second end face 7a, 7b, with the density distribution of said blank 1 essentially corresponding to the density distribution shown in FIG. 5. In this arrangement the cylindrical blank 1 and thus the density distribution are rotationally symmetrical in relation to a longitudinal axis 15 that extends in z-direction. The density is at its maximum in the center, i.e. at the point of intersection between a mid-plane 6 of the tempered blank 1 and the longitudinal axis 15; this is also where the strain birefringence of the tempered blank 1 is at its minimum 9.

In order to manufacture two plano-convex lens elements 5a, 5a' the tempered blank is divided, along the mid-plane 6 that serves as a cutting plane, into a first partial volume 1a and a second partial volume 1b, which partial volumes comprise an identical thickness d of somewhat less than 5 cm. The two plano-convex lens elements 5a, 5a' are arranged in the associated partial volumes 1a, 1b such that their planar lens surfaces 12 in each case point towards the mid-plane 6, and their vertices 8 point in the direction of the end faces 7a, 7b. As a result of this, during production of the lens elements 5a, 5b, the corner regions of the tempered blank 1, which corner regions comprise a particularly large absolute value of the strain birefringence, can be scooped out, and in this way the strain birefringence in said corner regions can be reduced. Moreover, the orientation of the strain birefringence in the lens elements 5a, 5b (principally in the xy-plane) is more favorable than that shown in FIG. 5c, thus resulting in less shifting after cutting, so that the characteristics of the lens elements 5a, 5a', which have been cut from the tempered blank 1, as far as strain birefringence is concerned are significantly improved when compared to those of the lens element shown in FIG. 5c. Depending on the beam path, a smaller scanning angle might also result, i.e. a smaller angle between the tensile strain and the light passing through the lens element, than is the case in the production techniques hitherto known. If the tensile strain is parallel in relation to the incident light, the influence which strain birefringence has on the light is close to zero; if both are at an angle of 90° C. in relation to each other the strain birefringence has maximum influence on the light.

It is understood that the tempered blank 1 does not necessarily have to be divided into two partial volumes 1a, 1b of equal size. In particular in the case of lens elements comprising a thickness of more than approx. 7-8 cm, it is advantageous if the tempered blank is divided asymmetrically, i.e. not along the mid-plane 6, because the thickness of the blank to be tempered should not exceed approximately 12 cm, so as to prevent excessively long tempering periods. In this way a thickness d of the first partial volume of approximately 70% of the thickness D of the tempered blank 1 is not exceeded.

Tempering the blank 1 of FIG. 1 to the same SBR does typically take longer than does tempering of the blank 1 shown in FIG. 1. However, the additional expenditure resulting from this is partly offset in that material wastage from cutting (as a result of transmission loss due to contamination) on two cover surfaces no longer occurs, and in that a higher SBR of the blank may be tolerated if said SBR is optimally oriented in relation to the shape of the finished lens.

It is also understood that the density distribution of the tempered blank 1, which density distribution is shown in FIG. 1, can alternatively also increase from the inside towards the outside if tempering is carried out while utilizing the cooling-rate anomaly. In this case too the minimum 9 of the strain birefringence is at the same location as is shown in FIG. 1 and coincides with the minimum of the density distribution.

The two plano-convex lens elements 5a, 5a', which have been produced from the tempered blank 1, have an absolute value of strain birefringence which is at a minimum on the planar lens surface 12 in the center of said lens surface 12. The absolute value of the strain birefringence along the entire planar lens surface 12 is less than 0.3 nm/cm in the case of a wavelength of 193 nm.

A thickness L of the plano-convex lens elements 5a, 5a' is given as the space between the vertex 8 and the planar lens surface 12. The difference between the thickness L of the first lens element 5a and the thickness of the first partial volume 1a essentially consists of the overmeasure that needs to be cut off, after tempering, along the end face 7a of the first partial volume 1a because this region was contaminated during tempering. In the tempered blank 1 described in FIG. 1 the sum of the lens thicknesses L is thus smaller than the thickness D of the blank 1. In the present case the thickness L of the lens elements 5a, 5a' is approximately 50 mm, while the radius of curvature r is approximately 55 mm.

Figure 2:
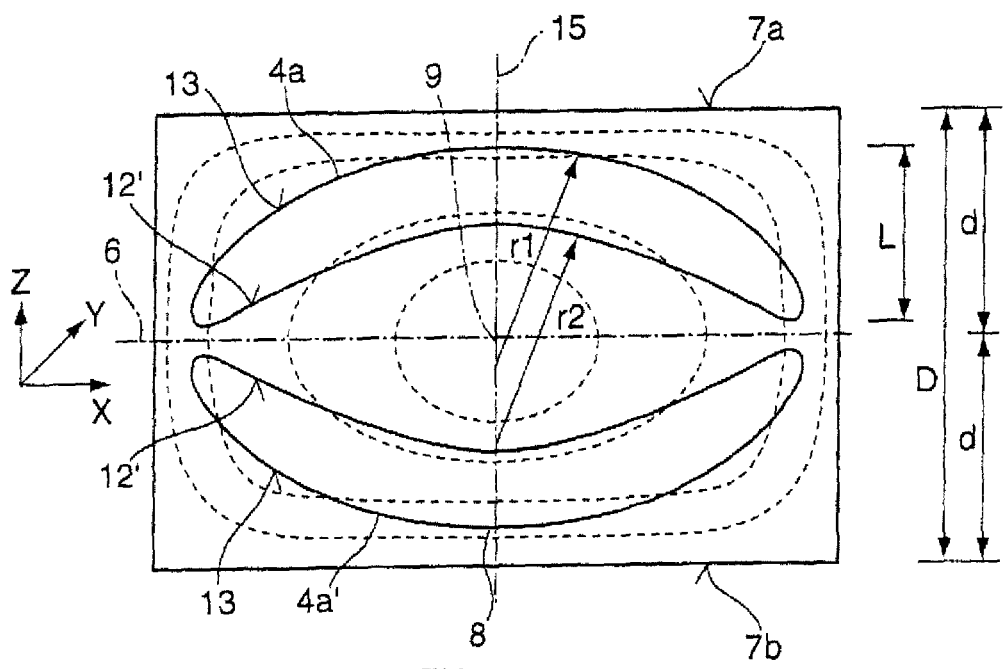
FIG. 2 a diagrammatic view of a tempered blank from which two meniscus lens elements are produced whose vertices are directed towards an end face of the tempered blank.

FIG. 2 shows a tempered blank 1 analogous to that shown in FIG. 1, from which blank 1 meniscus lens elements 4a, 4a' are formed, whose vertices 8 in each case are directed towards the end faces of the tempered blank 1. At the concavely curved lens surface 12' the meniscus lens elements 4a, 4a' comprise a radius of curvature $r_1$ of approximately 50 mm, which corresponds to the radius of curvature $r_2$ of an opposite convex lens surface 13. In this arrangement a thickness L of the meniscus lens elements 4a, 4a' corresponds to the thickness L of the plano-convex lens elements 5a, 5a' shown in FIG. 1, and is determined by their maximum extent in z-direction, i.e. from the vertex 8 to the maximum outer diameter of the concavely curved lens surface 12'. In this arrangement the minimum 9 of the SBR is located outside the lens volume; however, the position of the minimum can be deduced from the distribution of the SBR in the meniscus lens elements 4a, 4a'. As an alternative the minimum 9 could also be located more closely to the vertex 9, for example at a distance which represents 70% of the thickness L of the meniscus lens elements 4a, 4a'.

Figure 3:
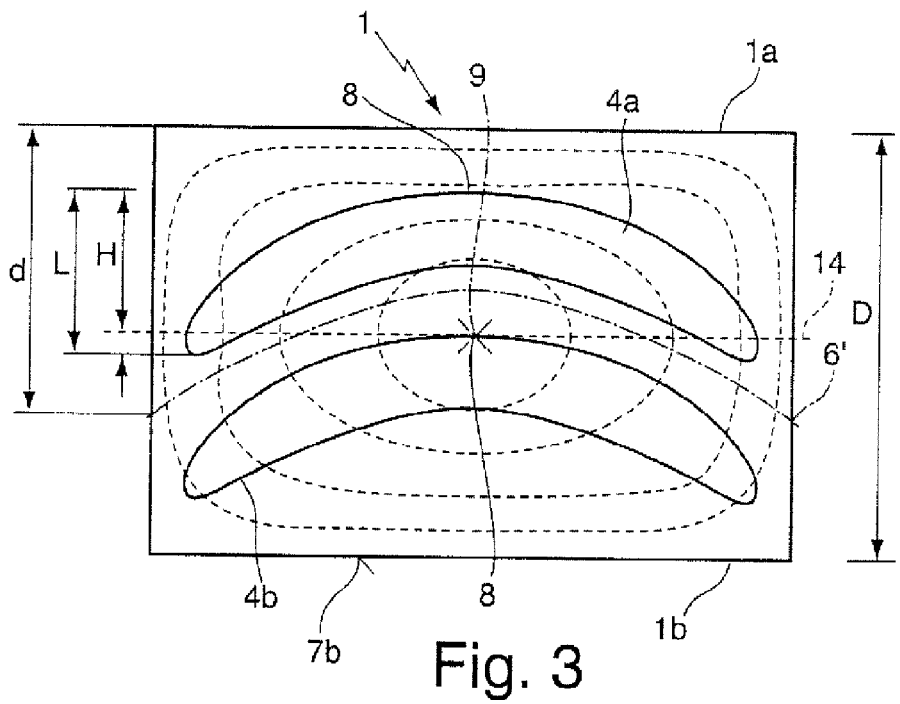
FIG. 3 a view, analogous to that of FIG. 2, in which the vertex of a lens element is directed away from the end face of the tempered blank.

An alternative design of two meniscus lens elements 4a, 4b is shown in FIG. 3. In this arrangement the vertex 8 of the second meniscus lens element 4b is oriented towards the center of the tempered blank; in this arrangement the vertex 8 thus coincides with the minimum 9 of the strain birefringence. With this alignment, if required, from the partial volume 1b not taken up by the second meniscus lens element 4b a further lens, for example a symmetrical lens, with a smaller diameter can be formed. In this arrangement, separation into the first partial volume 1a and into the second partial volume 1b extends along a spherical cut surface 6', wherein the thickness d of the first partial volume 1 is determined by its maximum extension in the z-direction.

The first meniscus lens element 4a comprises a minimum of the strain birefringence in a plane 14 which contains the (lower) optically clear diameter of the lens, and which is arranged at the height of the mid-plane of the tempered blank 1. The term "optically clear diameter" refers to the region through which useful light passes when the lens element 4a is installed in an optical system. Radiation outside this diameter is for example shaded by way of a holder that retains the lens element 4a. In the region of the optically clear diameter the radiation extends as a rule so as to be almost perpendicular in relation to the strain, so that the SBR is of particularly great consequence in that location. By placing the plane 14 with the optically clear diameter onto the mid-plane of the tempered blank 1, in that location an absolute value of strain birefringence of less than 0.3 nm/cm (for 193 nm) is produced, and thus the influence of the SBR in this region is reduced. The height H of the first meniscus lens element 4a is approximately 45 mm; said height H is determined by the distance between the vertex 8 and the plane 14 with the optically clear diameter. The minimum 9 of the SBR is located at a distance from the vertex 8 which corresponds to the height H representing about 90% of the thickness L of the first meniscus lens element 4a.

The second meniscus lens element 4b is cut out such that its edge regions originate from the corners of the tempered blank 1. In this way a greater absolute value of SBR arises, but its orientation then extends almost in z-direction. Depending on the beam path it is possible for the strain to be largely parallel in relation to the direction of light at the respective location in the lens so that this strain does not become effective. Furthermore, the density gradients are approximately perpendicular in relation to the lens surfaces. While this will result in a significant relaxation of the strain, the relaxation will however occur in the direction of the lens surfaces, i.e. there is a tendency for the strain only to reduce rather than to shift.

In relation to each lens geometry, by means of the beam path and finite-element simulation of the expected density profile and of the relaxation effects, calculations must be made to determine whether it is more favorable to use the first meniscus lens element 4a or the second meniscus lens element 4b. It is also possible to intentionally select the less favorable case in order to inscribe a systematic rotationally symmetrical SBR that can serve to compensate for birefringence that arises in other locations in the system.

Figure 4:
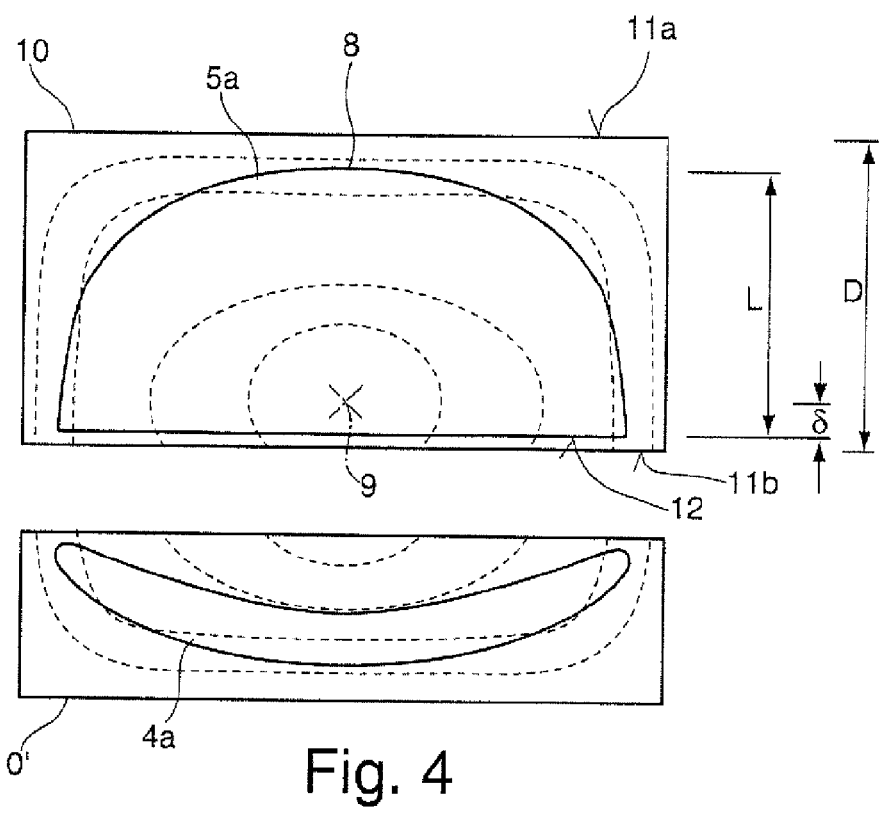
FIG. 4 a diagrammatic view of two lens blanks which have been manufactured by dividing a tempered blank.

Lastly, FIG. 4 shows two lens blanks 10, 10' which have been formed by cutting a tempered blank as shown in FIG. 1 to FIG. 3. From the first lens blank 10 a plano-convex lens element 5a is formed, while from the second lens blank a meniscus lens element 4a is formed. The lens blank 11a comprises two end faces 11a, 11b, between which a minimum of the SBR is arranged outside the middle, i.e. not situated in a mid-plane of the lens blank 11a. In this way the minimum 9 of the strain birefringence is situated inside the first lens blank 10 at a distance δ of approximately 10% of the thickness D from the planar lens surface 12 of the plano-convex lens element 5a close to the end face 11b, which during tempering was arranged in the interior of the blank 1 of FIGS. 1 to 3. As an alternative, said minimum 9 can also be arranged on the planar lens surface 12 itself.

The material of the lens blanks 10, 10' is fused silica designed for microlithography, i.e. comprising a transmission of more than 99.5%/cm at a wavelength of 193 nm, and comprising a hydrogen content of more than $0.5 \times 10^{16}$ molecules/cm$^3$. In the example shown in FIG. 4, the OH content of the lens blanks 10, 10' is less than 50 weight-ppm, i.e. it is fused silica with a low OH content, which is e.g. produced by drying the soot powder prior to sintering. Due to the low OH content it is necessary for all the high-temperature processes to be carried out before hydrogen is introduced into the glass, because otherwise SiH would form. For this reason so-called cold charging with hydrogen is carried out after tempering, i.e. at a temperature of less than 550° C., namely separately for each of the lens blanks 10, 10'. Charging after division of the tempered blank is sensible because the duration of charging increases squarely with the thickness of the blank.

In order to reduce the thickness it is favorable to bring the lens blanks 10, 10' before they are loaded with hydrogen to a shape that corresponds to the geometry of the lens elements 4a, 5a to be produced. This can take place in that, as shown in FIG. 3, when the tempered blank is divided, the cut surface 6' is already selected so that said cut surface 6' corresponds to the shape of, for example, a spherical lens surface. In addition or as an alternative, material removal from the lens blanks 10, 10' can also take place, as a result of which material removal a geometry that matches the shape of the lens element can be achieved. By the subsequent diffusing-in of hydrogen during charging, a distribution of the hydrogen concentration in the lens element is thus generated, in which distribution surfaces with identical hydrogen content, at least at small spacing (up to approximately 5 mm) from the lens surface, follow its shape. In particular, in that region the surfaces extend parallel in relation to the lens surfaces or have a corresponding curvature. In contrast to direct charging of the lens blanks 10, 10' without prior shaping, in this way a hydrogen distribution arises which in the direction of the z-axis is asymmetrical, i.e. which does not comprise any mirror symmetry in relation to this axis—in contrast to a distribution which would result in the case of charging the cylindrical lens blanks 10, 10' with a flat top surface and bottom surface.

It is understood that it is also possible to produce more than two lenses from associated partial volumes of the tempered blank. Furthermore, it is of course also possible to manufacture other, preferably asymmetrical, lens shapes than the plano-convex or meniscus lens elements shown as examples in the present documentation, e.g. lens shapes with aspherical lens surfaces. Moreover, apart from fused silica as a lens material it is also possible to use other glass-like or ceramic crystalline or polycrystalline materials that meet the requirements for use in microlithography.

Figure 6:
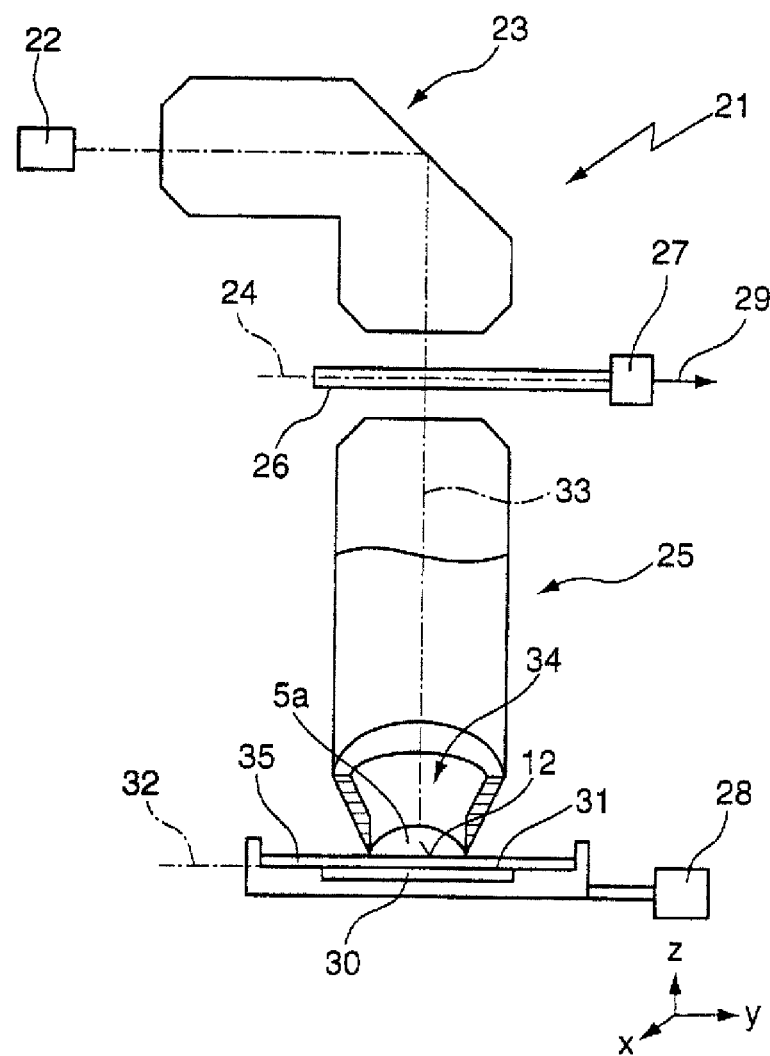
FIG. 6 a diagrammatic view of a projection exposure apparatus for immersion lithography with a plano-convex lens element as an end element.

The lens elements described above are preferably used in a projection exposure apparatus 21, designed as a wafer-stepper, for the manufacture of highly integrated semiconductor devices by means of immersion lithography, as is diagrammatically shown in FIG. 6; however, said lens elements can advantageously be used also in other optical systems. The projection exposure apparatus 21 comprises an excimer laser 22 as a light source with an operating wavelength of 193 nm. Of course, it is also possible to use other wavelengths, e.g. 248 nm. A subsequent illumination system 23 in its output plane 24 generates a large, sharply delimited and homogeneously illuminated image field.

Arranged downstream of the illumination system 23 there is a device 27 for holding and manipulating a mask 26, such that said mask 26 is arranged in an object plane 24 of a projection lens 25, where for the purpose of scanning it can be displaced in a transverse direction 29. Arranged downstream of the object plane 24, which is also known as the mask plane, is the projection lens 25, which images a structure arranged in the object plane 24 at a reduced scale, e.g. 4:1, 5:1 or 10:1, on a wafer 30 whose surface 31 comprises a photosensitive layer. In this arrangement the surface 31 is arranged in an image plane 32 of the projection lens 25. The wafer 30 is held by a device 28 that comprises a scanner drive in order to displace said wafer 30 synchronously with the mask 26 and parallel to said mask 26. The device 28 further comprises manipulators in order to displace the wafer 30 both in a direction (z) parallel to an optical axis 33 of the projection lens 25, and in a plane (x, y) perpendicular to said optical axis 33.

As an end element 34, which is opposite the surface 31 with the photosensitive substrate, the projection lens 25 comprises the plano-convex lens element 5a of FIG. 1 or FIG. 4 whose planar lens surface 12 is the last optical surface of the projection lens 25, which surface is arranged at a working distance to the surface 31 of the wafer 30. Between the end element 34 and the surface 31 with the photosensitive layer, water is arranged as an immersion liquid 35 by means of which the end element 34 establishes contact on the wafer side. The higher numerical aperture that is produced in this way makes it possible to image higher-resolution structures than would be possible with the use of air or a vacuum as a medium between the projection lens 25 and the surface 31 of the wafer 30.

If water is used as an immersion liquid 35, the plano-convex lens element 5a consists of fused silica with a thickness L of between 40 mm and 70 mm, preferably between 45 mm and 55 mm, wherein the radius of curvature r of the lens element is between 45 mm and 80 mm, preferably between 55 mm and 65 mm. Even if an immersion liquid 35 with a refractive index higher than that of water is used, the lens element 5a can be made from fused silica, wherein its dimensions (radius of curvature and thickness) in this case have to be matched correspondingly. In this arrangement the thickness L should be between 30 mm and 80 mm, preferably between 50 mm and 70 mm, and the radius of curvature r should be between 1.0 L and 2.0 L, preferably between 1.2 L and 1.6 L. As an alternative, a more highly refractive material, in particular a glass-like, crystalline, polycrystalline or ceramic material with a refractive index of approximately 1.6 or above (at a wavelength of 193 nm) can be selected for the lens element 5a. In this case the thickness of the lens element 5a should be less than 60 mm, preferably less than 50 mm.

The above description of the preferred embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

The invention claimed is:

1. A plano-convex lens element comprising a planar lens surface and a vertex separated from the planar lens surface by a lens element thickness L, and having a density distribution in which areas with at least substantially identical density are centered in each of three mutually orthogonal planes on a density minimum or a density maximum, wherein the density minimum or the density maximum is arranged at a distance from the planar lens surface, and wherein the distance is less than 30% of the thickness L of the lens element between the vertex and the planar lens surface.

2. The plano-convex lens element according to claim 1, wherein the distance from the planar lens surface to the density minimum or the density maximum is less than 20% of the thickness L of the lens element between the vertex and the planar lens surface.

3. A plano-convex lens element, with an optically used region defined by an optically clear diameter and bordered by a circumferential edge region, and comprising a planar lens surface, wherein an absolute value of a strain birefringence, any cubic centimeter along the planar lens surface and within the optically used region, is less than 0.5 nm/cm for a wavelength of 193 nm in any direction.

4. The plano-convex lens element according to claim 3, wherein the absolute value of the strain birefringence in any cubic centimeter along the planar lens surface and within the optically used region is less than 0.3 nm/cm for a wavelength of 193 nm.

5. The plano-convex lens element according to claim 1, wherein the thickness L of the lens element is between 40 mm and 70 mm and the radius of curvature r of the lens element is between 45 mm and 80 mm.

6. The plano-convex lens element according to claim 5, wherein the thickness L of the lens element is between 45 mm and 55 mm and the radius of curvature r of the lens element is between 55 mm and 65 mm.

7. The plano-convex lens element according to claim 1, wherein the thickness L of the lens element is between 30 mm and 80 mm and the radius of curvature r of the lens element is between 1.0 L and 2.0 L.

8. The plano-convex lens element according to claim 7, wherein the thickness L of the lens element is between 50 mm and 70 mm and the radius of curvature r of the lens element is between 1.2 L and 1.6 L.

9. The plano-convex lens element according to claim 1, consisting essentially of fused silica.

10. The plano-convex lens element according to claim 1, which has a refractive index of more than 1.57 at a wavelength of 193 nm, wherein the thickness L of the lens element is less than 60 mm.

11. The plano-convex lens element according to claim 10, wherein the thickness L of the lens element is less than 50 mm.

12. The plano-convex lens element according to claim 10, consisting essentially of a glass-like, crystalline, polycrystalline or ceramic material.

13. The plano-convex lens element according to claim 1, wherein the density minimum or the density maximum is an actual density minimum or actual density maximum located within the plano-convex lens element.

14. The plano-convex lens element according to claim 1, wherein the density minimum or the density maximum is an extrapolated density minimum or an extrapolated density maximum located external to the plano-convex lens element.

15. The plano-convex lens element according to claim 3, wherein the planar lens surface has a first optically clear diameter defining a first clear aperture area, and a further lens surface opposing the planar lens surface has a second optically clear diameter defining a second clear aperture area, and wherein a volume radially limited by the first clear aperture area and the second clear aperture area corresponds to the optically used region.

16. The plano-convex lens element according to claim 1, manufactured from a single, unitary volume of a fused silica blank.

* * * * *

UNITED STATES PATENT AND TRADEMARK OFFICE
CERTIFICATE OF CORRECTION

| | |
|---|---|
| PATENT NO. | : 8,780,448 B2 |
| APPLICATION NO. | : 13/465662 |
| DATED | : July 15, 2014 |
| INVENTOR(S) | : Eric Eva |

It is certified that error appears in the above-identified patent and that said Letters Patent is hereby corrected as shown below:

In the Claims:
Column 16; Line 51; In Claim 3; after "birefringence," insert -- in --.

Signed and Sealed this
Eighteenth Day of August, 2015

Michelle K. Lee
*Director of the United States Patent and Trademark Office*